United States Patent
Bohlländer

(10) Patent No.: US 11,450,621 B2
(45) Date of Patent: Sep. 20, 2022

(54) HOUSING FOR A CONVERTER, OUTPUT STAGE OF A CONVERTER HAVING SUCH A HOUSING, CONVERTER, AND AIRCRAFT HAVING A CONVERTER

(71) Applicant: Rolls-Royce Deutschland Ltd & Co KG, Blankenfelde-Mahlow (DE)

(72) Inventor: Marco Bohlländer, Hirschaid (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 0 days.

(21) Appl. No.: 16/981,085

(22) PCT Filed: Feb. 27, 2019

(86) PCT No.: PCT/EP2019/054808
§ 371 (c)(1),
(2) Date: Sep. 15, 2020

(87) PCT Pub. No.: WO2019/185268
PCT Pub. Date: Oct. 3, 2019

(65) Prior Publication Data
US 2020/0411451 A1 Dec. 31, 2020

(30) Foreign Application Priority Data
Mar. 27, 2018 (DE) .......................... 102018204625.5

(51) Int. Cl.
*H01L 23/00* (2006.01)
*H02M 1/088* (2006.01)
(Continued)

(52) U.S. Cl.
CPC .......... *H01L 23/562* (2013.01); *H02M 1/088* (2013.01); *H05K 7/1432* (2013.01); *H05K 9/0086* (2013.01)

(58) Field of Classification Search
CPC ....... H01L 2924/00; H01L 2224/32225; H01L 2924/00012; H01L 2924/00014;
(Continued)

(56) References Cited

U.S. PATENT DOCUMENTS 4,865,197 A * 9/1989 Craig .................. H05K 9/0067
206/709
5,136,119 A * 8/1992 Leyland ............... H05K 9/0043
174/379
(Continued)

FOREIGN PATENT DOCUMENTS

DE         19839422 A1    3/2000
DE      102012113130 A1    7/2013
(Continued)

OTHER PUBLICATIONS

German Search Report for German Application No. 10 2018 204 625.5 dated Jan. 14, 2019.
(Continued)

*Primary Examiner* — Krystal Robinson
(74) *Attorney, Agent, or Firm* — Lempia Summerfield Katz LLC

(57) ABSTRACT

A housing is provided for an output stage with power semiconductors of a modular converter. The housing includes a stretchable hood arranged on the base plate. The housing further includes a metallic lattice formed in or on the hood and forming a Faraday cage, wherein the hood is configured to be stretchable so as to enlarge the volume enclosed by the hood in the event of an explosion of a power semiconductor as a result of the explosion energy, without destroying the hood. An output stage, a converter, and an aircraft are also provided.

14 Claims, 3 Drawing Sheets

(51) Int. Cl.
*H05K 7/14* (2006.01)
*H05K 9/00* (2006.01)

(58) Field of Classification Search
CPC . H01L 2224/48227; H01L 2224/73265; H01L 2224/16225; H01L 2224/73204; H01L 2924/15311; H01L 2224/32145; H01L 2224/48091; H01L 2924/14; H01L 2924/3025; H01L 24/48; H01L 2924/0002; H01L 24/05; H01L 2224/04042; H01L 2924/181; H01L 21/0214; H01L 21/02164; H01L 21/0217; H01L 21/823481; H01L 2224/48463; H01L 27/0629; H01L 28/40; H01L 28/60; H01L 28/91; H01L 29/0692; H01L 29/66477; H01L 29/78; H01L 29/7833; H01L 2224/0401; H01L 2224/05552; H01L 2224/45015; H01L 2224/45099; H01L 23/552; H01L 25/0657; H01L 2924/207; H01L 2224/49171; H01L 2224/49175; H01L 2224/49177; H01L 23/645; H01L 2924/12042; H01L 2924/15788; H01L 2924/01079; H01L 2224/73253; H01L 2225/06513; H01L 2225/06517; H01L 2225/0652; H01L 2225/06572; H01L 2225/1023; H01L 2225/1041; H01L 2225/1058; H01L 2225/1088; H01L 23/49833; H01L 23/522; H01L 23/5225; H01L 23/60; H01L 24/73; H01L 25/0655; H01L 25/105; H01L 28/00; H01L 2924/1815; H01L 21/4882; H01L 21/76898; H01L 2224/05022; H01L 2224/05541; H01L 2224/0556; H01L 2224/05572; H01L 2224/05599; H01L 2224/16; H01L 2224/48137; H01L 2224/48157; H01L 2224/48247; H01L 2224/80895; H01L 2224/80896; H01L 2224/80986; H01L 2224/818; H01L 2224/81894; H01L 2224/83894; H01L 2225/06524; H01L 2225/06541; H01L 2225/06582; H01L 2225/06589; H01L 2225/06593; H01L 23/3107; H01L 23/3185; H01L 23/473; H01L 23/5223; H01L 23/564; H01L 23/642; H01L 24/06; H01L 24/49; H01L 24/80; H01L 24/81; H01L 24/94; H01L 25/18; H01L 25/50; H01L 2924/01013; H01L 2924/01014; H01L 2924/01022; H01L 2924/01029; H01L 2924/01032; H01L 2924/01033; H01L 2924/0105; H01L 2924/01074; H01L 2924/01082; H01L 2924/014; H01L 2924/19041; H01L 2924/19107; H01L 2924/3011; H01L 41/1136; H01L 41/31; H01L 21/30604; H01L 21/3065; H01L 21/823431; H01L 27/0886; H01L 27/11565; H01L 27/11575; H01L 27/11582; H01L 29/42392; H01L 29/66795; H01L 29/7854; H01L 29/78696; H01L 21/56; H01L 23/562; H01L 25/072; H05K 999/99; H05K 1/0298; H05K 1/11; H05K 1/144; H05K 2201/041; H05K 7/1432; H05K 9/0047; H05K 9/0086

USPC .................................. 310/240, 410; 361/752
See application file for complete search history.

(56) References Cited

U.S. PATENT DOCUMENTS

| | | | | | |
|---|---|---|---|---|---|
| 5,436,803 | A | * | 7/1995 | Annis | H05K 9/0043 174/382 |
| 5,901,040 | A | * | 5/1999 | Cromwell | H01L 23/427 361/704 |
| 6,528,924 | B1 | * | 3/2003 | Stelzl | H03H 9/059 310/313 R |
| 7,285,851 | B1 | * | 10/2007 | Cepeda-Rizo | G06F 1/20 257/712 |
| 2009/0284947 | A1 | * | 11/2009 | Beddingfield | H01L 23/49833 361/818 |
| 2010/0314726 | A1 | * | 12/2010 | Mueller | H05K 1/11 257/659 |
| 2011/0188204 | A1 | * | 8/2011 | Horiuchi | H01L 23/473 361/702 |
| 2016/0234356 | A1 | * | 8/2016 | Thomas | H04B 1/3838 |

FOREIGN PATENT DOCUMENTS

| | | |
|---|---|---|
| DE | 102015206627 A1 | 1/2016 |
| DE | 102018201202 A1 | 8/2019 |
| EP | 0033399 B1 | 2/1980 |
| EP | 0845809 A2 | 6/1998 |
| EP | 0984491 A1 | 3/2000 |
| EP | 1239649 A2 | 9/2002 |
| EP | 2062294 A1 | 5/2009 |
| EP | 2208225 A1 | 7/2010 |

OTHER PUBLICATIONS

International Search Report and the Written Opinion for International Patent Application PCT/EP2019/054808 dated May 28, 2019.

* cited by examiner

HOUSING FOR A CONVERTER, OUTPUT STAGE OF A CONVERTER HAVING SUCH A HOUSING, CONVERTER, AND AIRCRAFT HAVING A CONVERTER The present patent document is a § 371 nationalization of PCT Application Serial No. PCT/EP2019/054808, filed Feb. 27, 2019, designating the United States, which is hereby incorporated by reference, and this patent document also claims the benefit of German Patent Application No. 10 2018 204 625.5, filed Mar. 27, 2018, which is also hereby incorporated by reference.

TECHNICAL FIELD

The disclosure relates to a housing for a converter, an output stage of a modular converter having such a housing, a converter having an output stage, and an aircraft having a converter and an electric motor.

BACKGROUND

In the operation of power converters, it is necessary to overcome the problem of an "exploding" converter. "Exploding" means that the power semiconductors lose their controllability, the power loss increases to the maximum, and a short circuit of the bridge occurs. In this case, the total available high voltage (e.g., 750 V) is applied at the same time as the maximum current flow (e.g., 2000 A) on the chip surface of one phase (e.g., 5 cm$^2$), resulting in several megawatts of power on the very small surface.

The power semiconductor heats up, melts, and evaporates within a few microseconds. The result is an abruptly expanding plasma that damages surrounding parts. An exploding semiconductor may cause undefined collateral damage throughout the converter. The converter and thus, for example, an electric drive of an aircraft suffer a complete loss of function.

A power converter which uses an AC voltage or DC voltage to produce an AC voltage, the frequency and amplitude of which are varied, is referred to as a converter, (also called an inverter). Converters may be in the form of AC/DC-DC/AC converters or DC/AC converters, wherein an output AC voltage is produced from an input AC voltage or an input DC voltage via a DC voltage link circuit and clocked semiconductors.

SUMMARY

The object of the disclosure is to specify a solution for exploding power semiconductors of a converter.

According to the disclosure, this object is achieved with the housing for a converter, the output stage of a converter having such a housing, a converter, and an aircraft having a converter as disclosed herein. The scope of the present disclosure is defined solely by the appended claims and is not affected to any degree by the statements within this summary. The present embodiments may obviate one or more of the drawbacks or limitations in the related art.

The disclosure is based on the encapsulation of the output stage of the converter in a separate housing, as described in the post-published patent application DE 10 2018 2012 02 A1. The housing of the output stage is completely filled with an insulating oil or another insulating medium. The housing has a heat sink on the underside, (e.g., made of aluminum), on which the electrical and electronic components are arranged with an insulating separation layer.

The remaining part of the housing of the output stage is made of a stretchable material in the form of a hood acting as a shell, which extracts or absorbs the released energy from the expanding plasma of an exploding semiconductor by a stretching movement and a change in shape towards that of a sphere. The material, (e.g., non-conductive material), is held in shape by a metal lattice, which also performs the function of an earthing Faraday cage. The lattice size is selected according to the interfering emission frequency to be shielded.

The volume expansion in the event of an explosion is achieved by the fact that the basic housing shape is, or is at least similar to, a rectangular prism. In the event of an explosion, the interior expands, causing the flexible elastic hood, supported by the metal lattice, to tend towards the geometry of a sphere (e.g., minimum surface-area-to-volume ratio). For this purpose, filling spaces in the output stage between the individual components of a modular converter are kept free and used.

An advantageous material for the lattice (e.g., cage) is, for example, titanium or highly ductile aluminum, which is comparatively stretchable and resilient. This avoids using a heavy, but explosion-proof, all-aluminum cast housing.

The disclosure relates to a housing for an output stage with power semiconductors of a modular converter, including a base plate as the base body. A stretchable hood is arranged on the base plate, wherein a metallic lattice forming a Faraday cage is formed in or on the hood, the hood being stretchable so as to enlarge the volume enclosed by the hood in the event of an explosion of a power semiconductor as a result of the explosion energy, without destroying the hood.

In one development, the base plate may be designed as a heat sink.

In another embodiment, in an unstretched state the hood may be shaped as a rectangular prism.

In another embodiment, the lattice may be formed of titanium.

In another embodiment, the hood may be made of a textile-reinforced composite material.

In addition, the housing may include an insulating oil that fills the hood.

The disclosure also relates to an output stage of a modular converter having a housing and having power semiconductors arranged on the base plate.

The disclosure also relates to a converter having an output stage.

In addition, the disclosure also relates to an aircraft having an electric motor as a drive and having a converter, which supplies the electric motor with electrical energy.

BRIEF DESCRIPTION OF THE DRAWINGS

Further special features and advantages of the disclosure will become clear from the following explanations of an exemplary embodiment with reference to schematic drawings.

DETAILED DESCRIPTION

According to the disclosure, the output stage of a converter has a flexible, stretchable housing made of non-metal, which is encased in a Faraday metal cage (e.g., lattice) for grounding and shielding and which is stable to such an extent that it withstands an exploding plasma and prevents the non-metallic housing from bursting.

This expansion binds and absorbs energy, as does the expanding volume, and thus weakens the power of the explosion. The metal used for the supporting cage structure is not too rigid or brittle.

Figure 1:
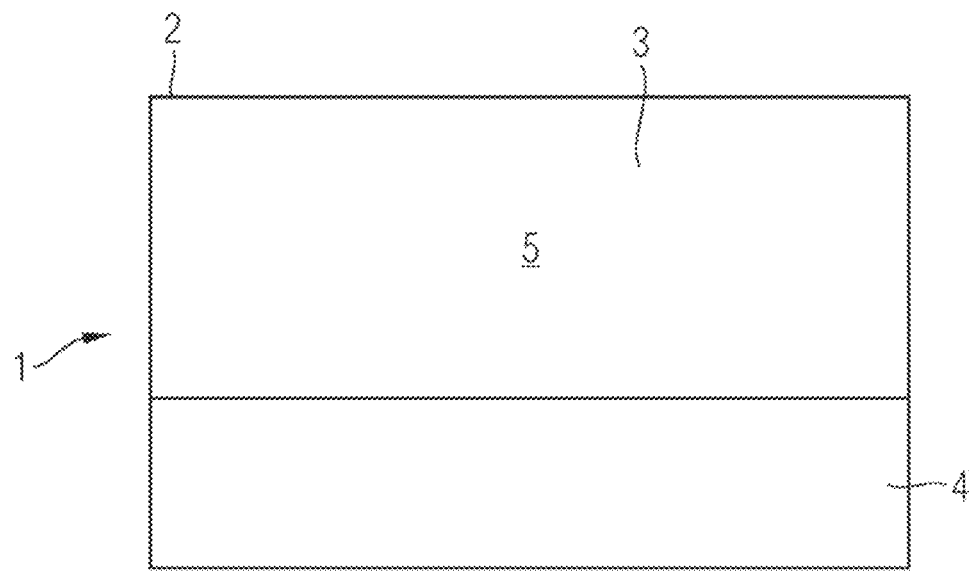
FIG. 1 depicts an example of a housing for an output stage.

FIG. 1 shows the housing 1 of an output stage of a modular converter. The housing has a base plate 4 made of aluminum, for example. On the base plate 4 is seated a hood or shell 2 made of a stretchable material, for example, a textile-reinforced composite material, in which or on which a metallic, cage-like lattice 3 is formed. The lattice 3 acts as a Faraday cage and may absorb energy by expansion. The housing 1 is filled with an insulating oil 5 that fills the shell 2. The shell 2 is formed in the shape of a rectangular prism and in the event of a change in volume caused by an explosion of power semiconductors it may assume a hemispherical shape.

Figure 2:
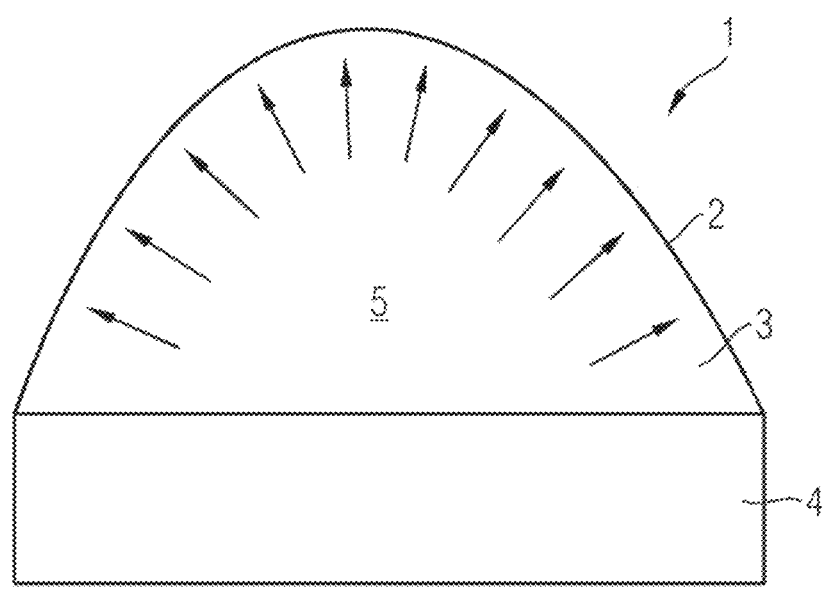
FIG. 2 depicts an example of an expanded housing for an output stage.

FIG. 2 shows the housing 1 according to FIG. 1 after the volume change (e.g., after an explosion of a power semiconductor). The hemispherical shape of the stretchable shell 2 increases the volume-to-surface-area ratio. The lattice 3 absorbs the explosion energy by changing its shape. The explosion of power semiconductors, which may be arranged on the base plate, does not therefore result in a rupture of the housing 1, but only to a permanent deformation of the housing.

Figure 3:
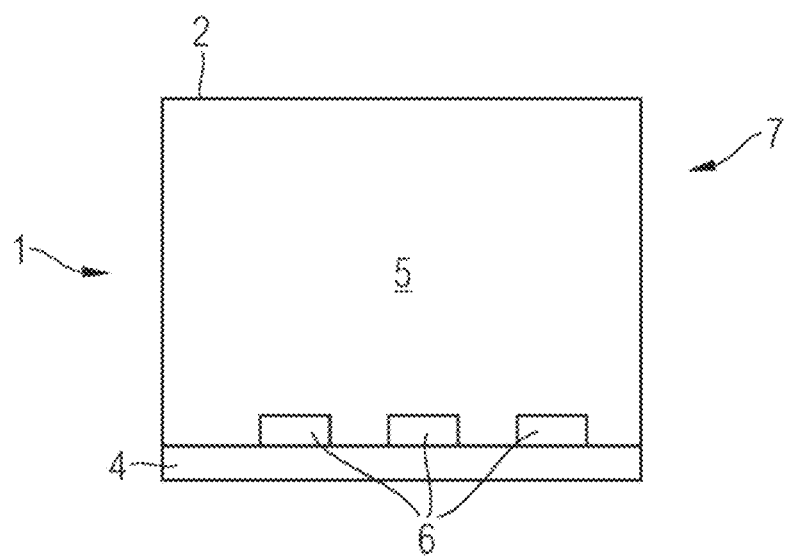
FIG. 3 depicts an example of an output stage of a modular converter.

FIG. 3 shows an output stage 7 of a modular converter having a housing 1 according to FIG. 1 and FIG. 2, wherein the power semiconductors 6 are arranged on the base plate 4 and insulated from the latter. The housing 1 is filled with an insulating oil 5 or another insulating material.

Figure 4:
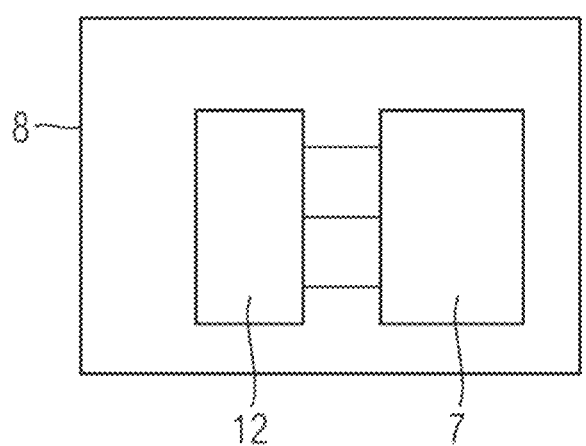
FIG. 4 depicts an example of a modular converter.

FIG. 4 shows a modular converter 8 with an output stage 7 according to FIG. 3, which is supplied by a link circuit 12.

Figure 5:
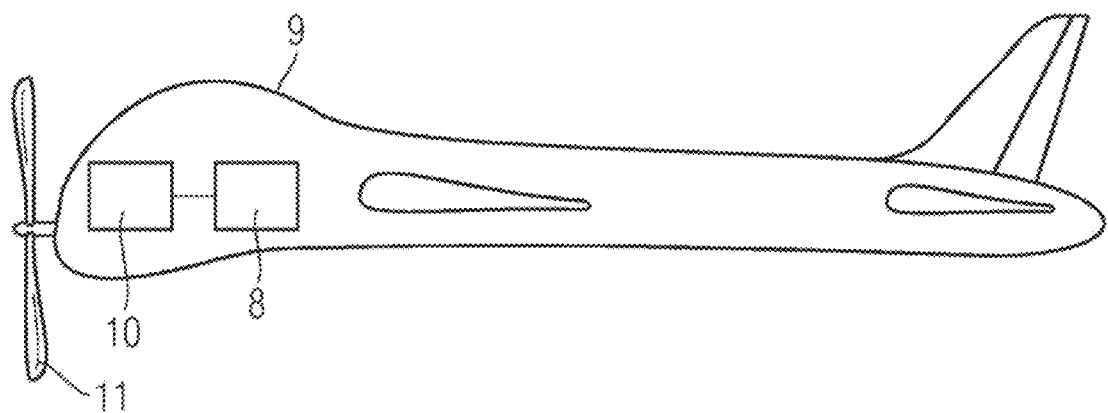
FIG. 5 depicts an example of an aircraft having a modular converter.

FIG. 5 shows an electrically powered aircraft 9, the propeller 11 of which is driven by an electric motor 10. The electric motor 10 is supplied with electrical energy by the converter 8. The converter 8 is designed according to FIG. 1 to FIG. 4.

Although the disclosure has been described and illustrated more specifically in detail by the exemplary embodiments, the disclosure is not restricted by the disclosed examples and other variations may be derived therefrom by a person skilled in the art without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

LIST OF REFERENCE SIGNS

1 Housing
2 Hood or Shell
3 Lattice
4 Base plate
5 Insulating oil
6 Power semiconductor
7 Output stage
8 Converter
9 Aircraft
10 Electric motor
11 Propeller
12 Link circuit

The invention claimed is:

1. A housing for an output stage having power semiconductors of a modular converter, the housing comprising:
   a base plate;
   a stretchable hood arranged on the base plate; and
   a metallic lattice positioned on the hood and forming a Faraday cage,
   wherein the hood is configured to be held in shape by the metallic lattice, and
   wherein the hood is configured to be stretchable so as to enlarge a volume enclosed by the hood in event of an explosion of a power semiconductor as a result of an explosion energy, without destroying the hood.

2. The housing of claim 1, wherein the base plate is a heat sink.

3. The housing of claim 2, wherein the hood has a rectangular prism shape in an unstretched state.

4. The housing of claim 3, wherein the lattice comprises titanium or a highly ductile aluminum.

5. The housing of claim 4, wherein the hood comprises a textile-reinforced composite material.

6. The housing of claim 5, further comprising:
   an insulating oil that fills the hood.

7. The housing of claim 1, wherein the hood has a rectangular prism shape in an unstretched state.

8. The housing of claim 1, wherein the lattice comprises titanium or a highly ductile aluminum.

9. The housing of claim 1, wherein the hood comprises a textile-reinforced composite material.

10. The housing of claim 1, further comprising:
    an insulating oil that fills the hood.

11. The housing of claim 1, wherein a size of the metallic lattice is selected based on an interfering emission frequency to be shielded.

12. An output stage of a modular converter, the output stage comprising:
    a housing having:
       a base plate;
       a stretchable hood arranged on the base plate; and
       a metallic lattice positioned on the hood and forming a Faraday cage,
       wherein the hood is configured to be held in shape by the metallic lattice, and
       wherein the hood is configured to be stretchable so as to enlarge a volume enclosed by the hood in event of an explosion of a power semiconductor as a result of an explosion energy, without destroying the hood; and power semiconductors arranged on the base plate of the housing.

13. A converter comprising:

an output stage having:
- a housing comprising a base plate, a stretchable hood arranged on the base plate, a metallic lattice positioned on the hood and forming a Faraday cage, wherein the hood is configured to be held in shape by the metallic lattice, and wherein the hood is configured to be stretchable so as to enlarge a volume enclosed by the hood in event of an explosion of a power semiconductor as a result of an explosion energy, without destroying the hood; and
- power semiconductors arranged on the base plate of the housing.

14. An aircraft comprising:

an electric motor as a drive; and a converter configured to supply the electric motor with electrical energy, the converter comprising an output stage having:
- a housing comprising a base plate, a stretchable hood arranged on the base plate, a metallic lattice positioned on the hood and forming a Faraday cage, wherein the hood is configured to be held in shape by the metallic lattice, and wherein the hood is configured to be stretchable so as to enlarge a volume enclosed by the hood in event of an explosion of a power semiconductor as a result of an explosion energy, without destroying the hood; and
- power semiconductors arranged on the base plate of the housing.

\* \* \* \* \*